Figure 1:
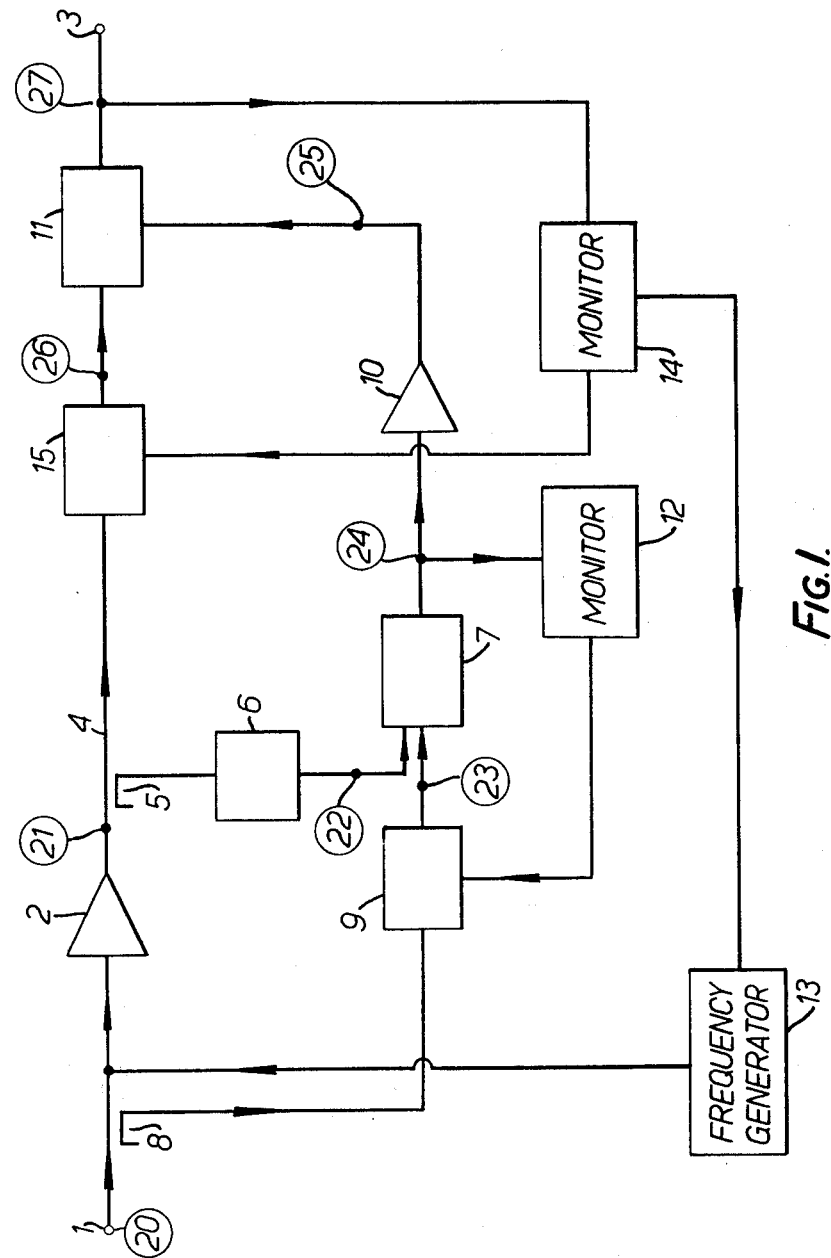

United States Patent [19]

Gerard

[11] 4,412,185

[45] Oct. 25, 1983

[54] FEEDFORWARD AMPLIFIERS

[75] Inventor: Roger E. J. Gerard, Chelmsford, England

[73] Assignee: The Marconi Company Limited, Chelmsford, England

[21] Appl. No.: 274,214

[22] Filed: Jun. 16, 1981

[30] Foreign Application Priority Data

Jul. 4, 1980 [GB] United Kingdom ................. 8021928

[51] Int. Cl.³ ............................................. H03F 1/26
[52] U.S. Cl. ..................................... 330/149; 330/151
[58] Field of Search ................................ 330/149, 151

[56] References Cited

FOREIGN PATENT DOCUMENTS 1542081  3/1979  United Kingdom .

Primary Examiner—James B. Mullins
Attorney, Agent, or Firm—Spencer, Kaye & Frank

[57] ABSTRACT

A feedforward amplifier is designed to exhibit particularly linear transfer characteristics in which distortion signals introduced by the amplifier itself are monitored and the phase and amplitude characteristics of respective adaptive equalizers are modified to reduce any distortions at these points. A reference signal is injected directly into a main amplifying element so that it appears at the output terminal as though it were an amplified induced distortion. The characteristics of the amplifier are adaptively modified to eliminate the reference signal from the output signal.

12 Claims, 2 Drawing Figures

FEEDFORWARD AMPLIFIERS

This invention relates to amplifiers and is specifically concerned with applying feedforward distortion cancellation to broadband amplifiers. Amplifying devices such as transistors and vacuum tubes are not perfectly linear over the whole of their operating ranges and the non-linearities in their transfer characteristics introduce distortions into signals which they amplify. In order to minimise the effect of the distortions, feedback and feedforward techniques have been used. To date, feedback amplifiers have been more commonly used. In a feedback amplifier, the output signal of an amplifying device is compared with its input and the same amplifying device is used to re-process the difference signal. Conversely a feedforward amplifier compares at the output of an amplifying device, the input signal with a fraction of the output signal of the amplifying device, and a separate amplifying device is used to provide a difference signal which is added in antiphase with the output signal to minimise the distortion. In principle, feedforward is capable of providing very good results, but in practice feedback is often preferred since the performance is not critically dependent on circuit component characteristics and tolerances in the same way that is feedforward.

The present invention seeks to provide an improved feedforward amplifier which is capable of exhibiting very linear transfer characteristics.

According to this invention a feedforward amplifier includes a main amplifying device coupled between an input terminal at which an input signal is received and an output terminal at which an amplified replica of the input signal is provided; comparison means for comparing a signal derived from the output of the main amplifying device with a fraction of the input signal to produce a difference signal representative of distortions introduced by said main amplifying device; combiner means for combining an amplified difference signal with the output of the main amplifying device to compensate for these distortions; means for injecting a reference signal into the main amplifying device and for monitoring the amplified signal present at said output terminal; and means for adjusting the transfer characteristic of the feedforward amplifier to minimise the amplitude level of said reference signal at said output terminal.

Figure 2:
Figure 2:
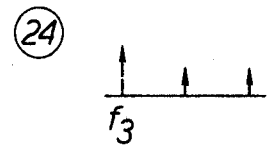
Figure 2:
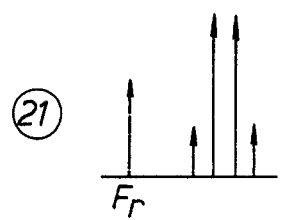
Figure 2:
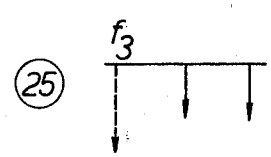
Figure 2:
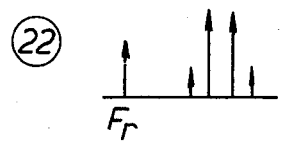
Figure 2:
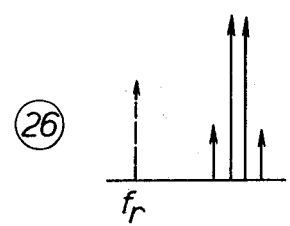
Figure 2:
Figure 2:
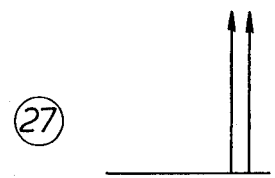

The present invention is further described by way of example with reference to the accompanying drawings in which, FIG. 1 shows in diagrammatic form a feedforward amplifier in accordance with the present invention and FIG. 2 shows an explanatory diagram.

Those portions of the feedforward amplifier shown in FIG. 1, which relate to conventional known feedforward amplifiers will first be described. An input signal which is to be amplified is received at an input terminal 1 and is passed via a main amplifying device 2 to an output terminal 3. The amplifier device 2 inevitably introduces distortions because of the non-linearities in its transfer characteristics. With a well designed amplifying device, these distortions will be small, but even so they may be unacceptably large for some applications. It becomes increasingly more difficult to keep these distortions to acceptably low levels as the power of the amplifying device increases because conversion efficiency becomes more important. In order to produce an indication of the level of these distortions, a signal derived from the output of the amplifying device 2 is compared with the original input signal obtained at terminal 1. A small fraction of the output signal power of the amplifying device 2 is removed from the main signal path 4 at a directional coupler 5 and fed via an attenuator 6 to one input of a comparator 7. A small fraction of the power of the input signal is coupled via another directional coupler 8 and a delay circuit 9 to the other input of the comparator 7. The attenuator 6 provides an attenuation factor which is the sum of the gain of the amplifier 2 and attenuation of the coupler 8 feeding the delay circuit 9 and the delay circuit 9 provides a delay equal to that produced by the amplifying device 2, the coupler 5 and the attenuator 6. Consequently, the two input signals to the comparator 7 are of the same amplitude and phase and the amplified output is therefore indicative of the distortion introduced by the amplifying device 2, assuming that no significant distortions are introduced by the attenuator 6 or the delay circuit 9. In practice, the attenuator 6 and the delay circuit 9 are composed wholly of passive devices which can be carefully designed so as to produce insignificant distortion.

The comparator 7 can conveniently comprise a hybrid transformer of known design.

The output of comparator 7 is fed via an amplifier 10 to a combiner 11, where the amplified signal is combined with the output of the main amplifying device 2. The gain of the amplifier 10 is exactly the same as the loss of the attenuator 6 plus the loss of the comparator 7 plus the loss of the combiner 11 less the loss in an equaliser 15 (referred to later) so that in principle the combiner 11 acts to cancel exactly for the aforementioned distortions, as the signal obtained from the amplifier 10 represents the distortions, and is fed in anti-phase to the combiner 11. Any known form of combiner 11 may be used, i.e. hybrid combiner, quarter wave coupler, or current subtractor.

The foregoing description sets out in a very brief and superficial fashion the mode of operation of a feedforward technique. A more detailed analysis is provided in the article "Feedforward-an alternative approach to amplifier linearisation" by T. J. Bennett and R. F. Clements, The Radio and Electronic Engineer, Vol. 44, No. 5, May, 1974.

In many instances the residual distortions present at the output terminal 3 are greater than can be accepted for many applications. Even if the feedforward amplifier system is initially set up so as to produce only very low level distortions, it is likely that its characteristics will deteriorate with time as the components age. Unlike a feedback amplifier, no automatic compensation is provided for variations and changes in component characteristics. Also in practice it is difficult to maintain a high degree of cancellation at all frequencies in high frequency broadland amplifiers.

In order to substantially improve the performance of the feedforward distortion cancellation technique, the present invention provides modifications to the circuit so far described. In particular, the circuit element referenced 9 is not merely a fixed delay circuit, but is instead an adaptive equaliser whose amplitude and phase characteristics are modified in dependence on the amplitude level of the output signal of comparator 7. This output signal is monitored by a monitor and control circuit 12, which controls the transfer characteristics of the equaliser 9 so as to minimise the amplitude of the difference signal provided by the output of comparator 7. Further-more, a frequency generator 13 injects a reference frequency directly into the input of the main amplifier device 2 under the control of a further monitor and control circuit 14. The monitor circuit 14 monitors the signal present at the output terminal 3 and modifies the characteristics of a further equaliser circuit 15, so as to remove the injected reference signal from the amplified output signal present at terminal 3. The equaliser circuit 15 could, instead of being between the main amplifying device 2 and the combiner 11, be positioned between the comparator 7 and the combiner 11 to obtain the same effect.

Examples of adaptive equalisers incorporating amplifiers are referred to in Bell Systems T. J. December, 1974, p. 1953–1985.

Monitor 12 can be a relatively simple device, basically a level indicator. It can use the traffic being handled by the amplifier as a reference. Alternatively an external reference signal could be used (not shown). By making monitor 12 frequency selective, and the reference signal coded to avoid ambiguity, the equaliser could be adjusted on traffic-this aspect is referred to later.

Monitor 14 can be a relatively simply device if it is only to operate with a wanted reference signal and without traffic. The dynamic range may have to be wider than monitor 12.

The purpose of the equaliser 9 and its associated monitor and control 12, is to reduce the power handled by amplifier 10. This is done by cancelling the fundamental power in the comparator 7, so that amplifier 10 has to handle only distortion and noise introduced by amplifier 2. This is to prevent distortion of the signals being handled by 10 from introducing further spurious signals at the output 3, which could not be cancelled.

The purpose of the equaliser 15 and its associated monitor and control 14, is to achieve a high level of subtraction of the distortion signals generated in main amplifier 2 by those distortion terms amplified by amplifier 10. If the subtraction of this second loop is poor, then the reduction of the unwanted distortion signals between the output of amplifier 2 and the system output 3 will be small.

It will be noted that in a known conventional feedforward amplifier, no compensation is provided for any distortions which are introduced by amplifier 10. It is expected that the level of distortions introduced by this amplifier will be very much less than that produced by the main amplifying device 2, since it is now possible to operate them at much lower power levels. Nevertheless, it is inevitable that comparator 7 operates at a significant power level, since its input voltage obtained via the equaliser 9 is directly related to the level of the received input signal. The other input signal obtained via the attenuator 6 is of the same amplitude level and contains not only an attenuated signal which is representative of the wanted amplified signal, but also the distortion components.

The two signals which are received by the differential comparator 7, are, of course, received from the input terminal 1 over two quite different paths and it is important to equalise so far as is possible the transfer characteristics of these two paths, and this is achieved by altering the characteristics of the equaliser 9 so as to minimise the output level of the comparator 7 as monitored by the monitor circuit 12. In principle, the undistorted or fundamental components of the signals fed to the amplifier 10 can be removed in this way, leaving only the distortion components.

The frequency generator 13 introduces a low level reference signal directly into the amplifier 2. It is not coupled by the coupler 8 to the equaliser 9, and consequently the comparator 7 provides as an output of the reference signal generated by frequency generator 13. A sample of this reference signal appears at the output of comparator 7, since no corresponding signal is received via the equaliser 9. The reference signal which is then amplified via amplifier 10 should cancel out the reference signal passing through units 2, 5, 15, when it is combined with the main amplified signal at combiner 11. Any residual reference signal which reaches terminal 3 is therefore indicative of the extent of cancellation of the reference signal via the two independent paths through units (2, 5, 11) and units (2, 5, 6, 7, 10, 11). The monitor 14 is arranged to specifically monitor the level of this reference frequency and to control the phase and amplitude characteristics of an adaptive equaliser 15 until they disappear entirely.

To achieve good performance over a wide range of frequencies, the injected reference signals will have to operate at several frequencies over the operation band, and the equaliser adjusted at each frequency. This can be achieved with a single reference which can be adjusted successively to the required frequencies.

A simple wideband monitor can provide the information to the control circuits, which in turn adjusts the appropriate frequency band of the equaliser to achieve improved cancellation. This is repeated at all reference frequencies successively. Due to interaction between adjacent sections of the equaliser, it is expected that each equaliser band will require several adjustments before the desired degree of cancellation is achieved over the whole of the operating band at the same time.

Alternatively the reference signal could comprise a comb of frequencies. The monitor would then be frequency selective, and adjusted to respond to a particular frequency whilst the appropriate band of the equaliser was adjusted.

These procedures for adjusting the cancellation of the two pairs of parallel paths could be regarded as an initial setting-up or calibration routine, at regular intervals, e.g. the start of each shift. Alternatively, by making the reference signals very much lower than the wanted signals and by utilising a wide dynamic range frequency selective monitor the alignment of the second equaliser could be continuous, even in the presence of high power signals being amplified by the main amplifier. To prevent spurious operation the reference signals require to be coded. The first equaliser could be adjusted by monitoring the output of comparator 7, and adjusting the appropriate band of the equaliser using either a reference signal or the wanted signals being handled by the main amplifier.

In this way the overall performance of the feedforward amplifier can be continuously controlled, so as to compensate for variations in component parameters including temperature and ageing effects. If an input signal is not received continuously at terminal 1, it would, of course, be possible to use non-coded reference signals during those intervals when no input signal is present. This would be possible particularly with time division multiplexed input signals in which unused windows periodically appear in the input signal.

As indicated previously it is necessary to adjust the relative amplitude/delay of the two paths between points 21 and 27 to be the same. Thus the equaliser 15 could be a fixed delay and an adjustable delay inserted between the comparator 7 and amplifier 10.

The operation of the amplifier is further described with reference to FIG. 2 in which the signal amplitudes appearing at various points on FIG. 1 are shown. For ease of explanation, it is assumed that the input terminal 1 receives two tones which are spaced apart from each other by a relatively small frequency itself. It is well known that the third order intermodulation products produced by such a pair of tones are spaced very close to the tones themselves with one intermodulation product appearing on each side of the two tones. This enables the intermodulation products and the tones themselves to be conveniently illustrated in the same diagram. The relatively low level signals, as indicated at point 20, are amplified by the main amplifying device 2 to produce the higher amplitude signals indicated at point 21. In addition, the relatively low level third order intermodulation products appear. These represent the distortions introduced by the amplifying device 2 on account of non-linearities in its transfer characteristic. It is distortions such as these as well as all forms of distortion that the present feedforward amplifier seeks to remove. The signal obtained at point 21 is fed via the attenuator 6 to point 22. As previously mentioned the attenuator 6 provides an attenuator factor, so that the two inputs to the comparator 7 are of the same level. The attenuated output of the attenuator 6 is indicated at 22 on FIG. 2. It will be appreciated from this diagram that the effect of attenuating the main tones has the effect of making the third order intermodulation products extremely small. The relative amplitudes of the third order intermodulation products as compared with that of the main tones has been greatly exaggerated in FIG. 2 for the sake of clarity. Point 23 indicates the undistorted original tones received via the equaliser 9 and point 24 shows the removal of the original two tones to leave only the third order intermodulation products. As previously described the two fundamental tones are removed by the action of the monitor 12 in modifying the characteristics of the equaliser 9, so as to provide an amplitude delay which corresponds for the delay via the amplifying device 2 and the attenuator 6. These distortion signals are amplified and inverted by amplifier 10 and the result of this is indicated at point 25. At this stage, the third intermodulation products are exactly equal in amplitude, but of opposite phase to the main signal provided by equaliser 15 at point 26. Consequently, the distortions cancel in the combiner 11 to leave only the original two tones which have been amplified by the required amount.

The reference frequency generated by the frequncy generator 13 is indicated by the frequency $f_r$ and its presence at the various identified points on FIG. 1 is correspondingly illustrated in FIG. 2. It is by searching for the presence of the frequency $f_r$ at the point 27 that the monitor 14 adjusts equaliser 15 to eliminate it. It will be understood that FIG. 2 illustrates the situation when both equalisers 9 and 15 have been correctly aligned to eliminate the distortion.

I claim:

1. A feedforward amplifier including a main amplifying device coupled between an input terminal at which an input signal is received and an output terminal at which an amplified replica of the input signal is provided; comparison means for comparing a signal derived from the output of the main amplifying device with the input signal to produce a difference signal representative of distortions introduced by said main amplifying device; combiner means for combining an amplified difference signal with the output of the main amplifying device to compensate for these distortions; means for injecting a reference signal into the main amplifying device and for monitoring the amplified signal present at said output terminal; and means for adjusting the transfer characteristic of the feedforward amplifier to minimise the amplitude level of said reference signal at said output terminal.

2. An amplifier as claimed in claim 1 and wherein said means for adjusting the transfer characteristic comprises an adaptive equaliser positioned so as to modify at least one of the signals received at said combiner means.

3. An amplifier as claimed in claim 2 and wherein the equaliser is positioned between said main amplifying device and said combiner means.

4. An amplifier as claimed in claim 2 and wherein the equaliser is arranged to modify the phase and amplitude of a signal fed to it in dependence on the amplitude level of said reference signal at said output terminal, whilst providing a delay which compensates for relative delays experienced by the two signals which are combined at said combiner means.

5. An amplifier as claimed in claim 2, and wherein for wide frequency band operation said reference signal comprises a plurality of discrete frequency tones distributed across the frequency band.

6. An amplifier as claimed in claim 2 wherein for wide frequency band operation said reference signal comprises a frequency tone whose frequency is adjustable across a wide frequency band.

7. An amplifier as claimed in claim 1 and wherein said reference signal is coded to facilitate its detection at said output terminal.

8. An amplifier as claimed in claim 5 and wherein the means for monitoring the amplified signal present at said output terminal includes a frequency selective device tuned to each of the frequency tones.

9. An amplifier as claimed in claim 8 and wherein the phase and amplitude of said equaliser are adjusted to minimise the amplitude of each of the frequency tones.

10. An amplifier as claimed in claim 3 and wherein said input signal is fed via a further adaptive equaliser to said comparison means along a path which is in parallel with said main amplifying device, said further equaliser being arranged to modify the input signal fed it in dependence of the amplitude of said difference signal, whilst providing a delay which compensates for relative delays experienced by the two signals which are compared at said comparison means.

11. An amplifier as claimed in claim 10 and including means for monitoring said difference signal, and which is operative to control the transfer characteristics of said further adaptive equaliser to minimise the amplitude of said difference signal.

12. An amplifier as claimed in claim 11 and wherein both the phase and amplitude characteristics of said further adaptive equaliser are modified to minimise the amplitude of said difference signal.

* * * * *